United States Patent
Chen

(10) Patent No.: US 8,008,987 B2
(45) Date of Patent: Aug. 30, 2011

(54) BALUN CIRCUIT MANUFACTURED BY INTEGRATE PASSIVE DEVICE PROCESS

(75) Inventor: Chi-Han Chen, Cishan Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 55 days.

(21) Appl. No.: 12/391,421

(22) Filed: Feb. 24, 2009

(65) Prior Publication Data

US 2010/0060375 A1  Mar. 11, 2010

Related U.S. Application Data

(60) Provisional application No. 61/136,504, filed on Sep. 10, 2008.

(30) Foreign Application Priority Data

Dec. 9, 2008  (TW) .............................. 97147869 A

(51) Int. Cl.
  *H03H 7/42* (2006.01)
  *H01P 3/08* (2006.01)
(52) U.S. Cl. ......................................... 333/25; 333/238
(58) Field of Classification Search .................... 333/25, 333/26, 238; 336/200
See application file for complete search history.

(56) References Cited

U.S. PATENT DOCUMENTS

| | | | |
|---|---|---|---|
| 5,793,265 A | 8/1998 | Spielman | |
| 6,097,273 A * | 8/2000 | Frye et al. | 336/200 |
| 6,577,219 B2 | 6/2003 | Visser | |
| 6,798,326 B2 | 9/2004 | Iida | |
| 6,927,664 B2 | 8/2005 | Nakatani et al. | |
| 7,129,803 B2 | 10/2006 | Khorram et al. | |
| 7,629,860 B2 * | 12/2009 | Liu et al. | 333/25 |
| 2009/0039999 A1 | 2/2009 | Fujii et al. | |
| 2009/0146770 A1 | 6/2009 | Lee et al. | |
| 2010/0060402 A1 * | 3/2010 | Chen | 336/200 |

* cited by examiner

*Primary Examiner* — Dean O Takaoka

(74) *Attorney, Agent, or Firm* — Bacon & Thomas, PLLC

(57) ABSTRACT

A Balun circuit manufactured by integrate passive device (IPD) process. The Balun circuit includes a substrate, a first coplanar spiral structure, and a second coplanar spiral structure. One end of the innermost first left coil of the first coplanar spiral structure is electrically connected to the innermost first right coil through a first bridge. Two ends of the first coplanar spiral structure are electrically connected to the outermost first left coil and the outermost right coil respectively. One end of the innermost second left coil of the second coplanar spiral structure is electrically connected to the innermost second right coil through a second bridge. Two ends of the second coplanar spiral structure are electrically connected to the outermost second left coil and the outermost second right coil respectively. The first left coils and the second left coils are interlaced. The first right coils and the second right coils are interlaced.

20 Claims, 5 Drawing Sheets

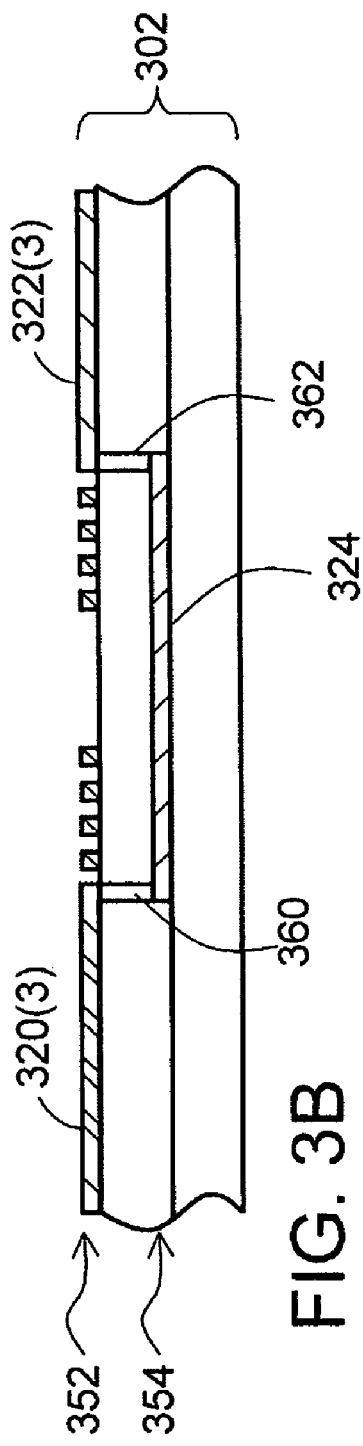
FIG. 3B
FIG. 4B
FIG. 4A

BALUN CIRCUIT MANUFACTURED BY INTEGRATE PASSIVE DEVICE PROCESS

This application claims the benefit of U.S. Provisional Application Ser. No. 61/136,504, filed Sep. 10, 2008 and Taiwan application Serial No. 97147869, filed Dec. 9, 2008, the subject matter of which is incorporated herein by reference.

BACKGROUND OF THE INVENTION

1. Field of the Invention

The invention relates in general to a Balun circuit, and more particularly to a Balun circuit manufactured by integrate passive device (IPD) process.

2. Description of the Related Art

Generally speaking, after the antenna of a communication device receives a wireless signal, the antenna will output a single-port signal to a Balun circuit. The Balun circuit will transform the single-port signal to a dual-port signal, and further outputs the dual-port signal to the radio frequency (RF) transceiver for further processing.

Currently, the Balun circuit is manufactured by low temperature co-fired ceramic (LTCC) process. However, the Balun circuit manufactured by the LTCC process must be electrically connected to a substrate through surface-mount technology (SMT) before electrically connecting with the RF transceiver chip disposed on the substrate. As the substrate must reserve the area for the Balun circuit manufactured by the LTCC process and for the RF transceiver chip, the substrate requires a larger area and occupies a larger space in the communication device. Thus, how to reduce the required area for the substrate so as to save the internal space for the communication device has become a focus to the manufacturers.

SUMMARY OF THE INVENTION

The invention is directed to a Balun circuit manufactured by integrate passive device (IPD) process. The Balun circuit can be directly disposed on the RF transceiver chip, hence reducing the required substrate area and saving the internal space for the communication device using the Balun circuit of the invention.

According to a first aspect of the present invention, A Balun circuit manufactured by integrate passive device (IPD) process is provided. The Balun circuit includes a substrate, a first coplanar spiral structure and a second coplanar spiral structure. The first coplanar spiral structure has a first end, a second end, several first left coil, several first right coils and a first bridge. One end of the innermost first left coil is electrically connected to the innermost first right coil through a first bridge. The first end is electrically connected to the outermost first left coil. The second end is electrically connected to the outermost first right coil. The second coplanar spiral structure has a third end, a fourth end, several second left coils, several second right coils and a second bridge. One end of the innermost second left coil is electrically connected to the innermost second right coil through the second bridge. The third end is electrically connected to the outermost second left coil. The fourth end is electrically connected to the outermost second right coil. The first left coils and the second left coils are interlaced. The first right coils and the second right coils are interlaced.

The invention will become apparent from the following detailed description of the preferred but non-limiting embodiments. The following description is made with reference to the accompanying drawings.

BRIEF DESCRIPTION OF THE DRAWINGS

FIG. 3B shows a cross-sectional view of the Balun circuit of FIG. 3A along a cross-sectional line 3B-3B';

FIG. 4A shows an example of disposition relationship between an IPD having a Balun circuit of the present embodiment of the invention and an RF transceiver chip;

FIG. 4B shows another example of disposition relationship between an IPD having a Balun circuit of the present embodiment of the invention and an RF transceiver chip;

DETAILED DESCRIPTION OF THE INVENTION

Figure 1:
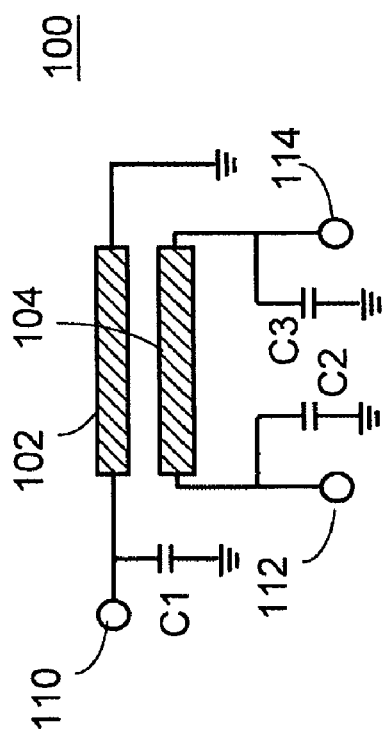
FIG. 1 shows a Balun circuit.

Referring to FIG. 1, a Balun circuit is shown. The Balun circuit includes two transmission lines 102 and 104 and three capacitors C1, C2 and C3. One end of the transmission line 102 is electrically connected to an unbalance port 110, and the other end of the transmission line 102 is grounded. One end of the transmission line 104 is electrically connected to the balance port 112 and the capacitor C2, and the other end of the transmission line 104 is electrically connected to the balance port 114 and the capacitor C3 respectively.

Figure 2:
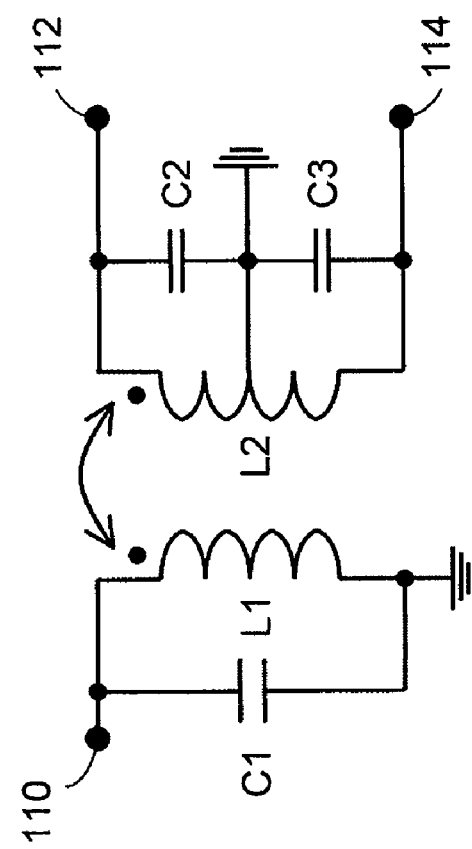
FIG. 2 shows an equivalent circuit diagram of the Balun circuit of FIG. 1.

Referring to FIG. 2, an equivalent circuit diagram of the Balun circuit of FIG. 1 is shown. The transmission line 102 is equivalent to an inductance L1, and the transmission line 104 is equivalent to an inductance L2. For an alternate current signal, the middle point of the transmission line 104 can be viewed as being connected to virtual ground, so the voltage of the center of the inductance L2 of the equivalent transmission line 104 is equivalent to ground voltage. Due to the coupling effect between the inductances L1 and L2, the single-ended signal inputted by the unbalance port 110 is transformed to a differential signal outputted by the balance ports 112 and 114. The signals outputted by the balance ports 112 and 114 have the same amplitude, but the phases of the two signals differ by 180 degrees.

The capacitors C1, C2 and C3 are used for adjusting bandwidth of the passband, adjusting insertion loss, or performing impedance transformation.

Figure 3A:
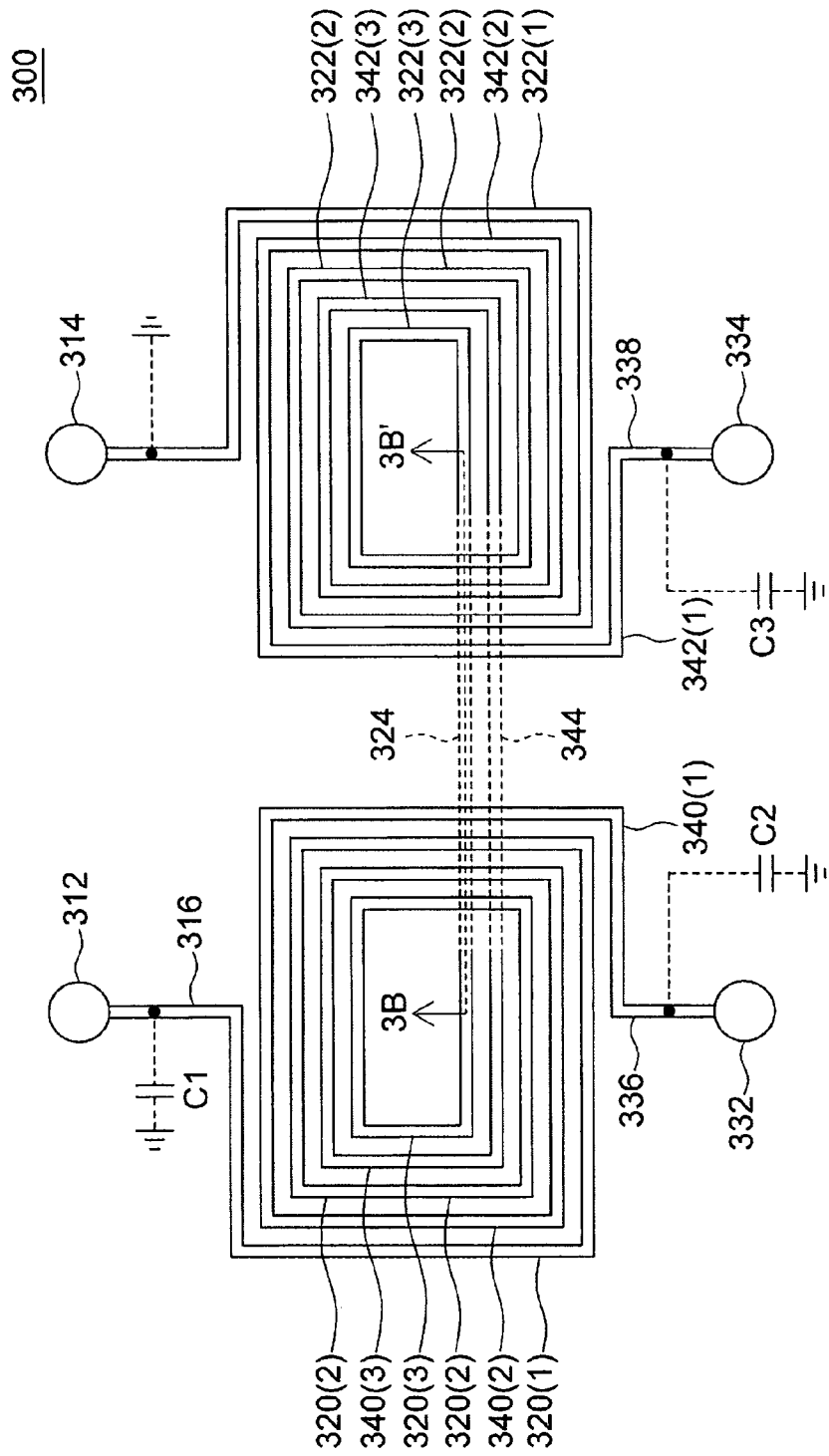
FIG. 3A shows a structural diagram of a Balun circuit manufactured by integrate passive device (IPD) process according to an embodiment of the invention.

Referring to FIG. 3A and FIG. 3B at the same time. FIG. 3A shows a structural diagram of a Balun circuit manufactured by integrate passive device (IPD) process according to an embodiment of the invention. FIG. 3B shows a cross-sectional view of the Balun circuit of FIG. 3A along a cross-sectional line 3B-3B'. The Balun circuit 300 includes a substrate 302 (illustrated in FIG. 3B), a first coplanar spiral structure, and a second coplanar spiral structure. The first coplanar spiral structure has a first end 312, a second end 314, several first left coils, several first right coils and a first bridge 324.

The first left coils include three left coils 320(1), 320(2) and 320(3) for example. The first right coils include three right coils 322(1), 322(2) and 322(3) for example.

In the first coplanar spiral structure, one end of the innermost first left coil 320(3) is electrically connected to the innermost first right coil 322(3) through the first bridge 324, the first end 312 is electrically connected to the outermost first left coil 320(1), and the second end 314 is electrically connected to the outermost first right coil 322(1).

The second coplanar spiral structure includes a third end 332, a fourth end 334, several second left coils, several second right coils and a second bridge 344. The second left coil include three the second left coil 340(1), 340(2) and 340(3) for example. The second right coils include three second right coils 342(1), 342(2) and 342(3) for example.

In the second coplanar spiral structure, one end of the innermost second left coil 340(3) is electrically connected to the innermost second right coil 342(3) through the second bridge 344, the third end 332 is electrically connected to the outermost second left coil 340(1), and the fourth end 334 is electrically connected to the outermost second right coil 342(1).

The first left coils and the second left coils are interlaced, and the first right coils and the second right coils are interlaced. For example, the first left coils and the second left coils are disposed in the order of the second left coil 340(1), the first left coil 320(1), the second left coil 340(2), the first left coil 320(2), the second left coil 340(3), the first left coil 320(3) from outside to inside. The first right coils and the second right coils are disposed in the order of the second right coil 342(1), the first right coil 322(1), the second right coil 342(2), the first right coil 322(2), the second right coil 342(3), the first right coil 322(3) from outside to inside.

Preferably, the first left coils 320(1) to 320(3) and the second left coils 340(1) to 340(3) are equally spaced apart. The first right coils 322(1) to 322(3) and the second right coil 342(1) to 342(3) are equally spaced apart. The first end 312 is electrically connected to the outermost first left coil 320(1) through the connecting line 316. The second end 314 is electrically connected to the outermost first right coil 322(1) through the connecting line 318. The third end 332 is electrically connected to the outermost second left coil 340(1) through the connecting line 336. The fourth end 334 is electrically connected to the outermost second right coil 342(1) through the connecting line 338.

Furthermore, referring to FIG. 3B, the substrate 302 has a first wiring layer 352 and a second wiring layer 354. In the first coplanar spiral structure, the first the connecting line 316, the second the connecting line 318, the first left coils 320(1) to 320(3) and the first right coils 340(1) to 340(3) are disposed on the first wiring layer 352, and the first bridge 324 is disposed on the second wiring layer 354. The first left coil 320(3), for example, is electrically connected to the first bridge 324 through a via hole 360, and the first bridge 324 is electrically connected to the first right coil 322(3) through a via hole 362, such that the first left coil 320(3) is electrically connected to the first right coil 322(3) through the first bridge 324.

In the second coplanar spiral structure, the first connecting line 336, the second connecting line 338, the second left coil 340(1) to 340(3), the second right coil 342(1) to 342(3) are disposed on the first wiring layer 352. The second bridge 344 is disposed on the second wiring layer 354.

Preferably, the sum of the lengths of the first left coil 320(1) to 320(3) is substantially equal to that of the first right coil 322(1) to 322(3). The sum of the lengths of the second left coil 340(1) to 340(3) is substantially equal to that of the second right coil 342(1) to 342(3). Thus, when the first end 312 is used as an unbalance port 110, the second end 314 is grounded, and the third end 332 and the fourth end 334 are used as a balance port 112 and a balance port 114 respectively, the third end 332 and the fourth end 334 output two signal substantially having the same amplitude, and the phase imbalance of the two signals is 180 degrees.

As indicated in FIG. 3A, the first end 312, the third end 332 and the fourth end 334 are electrically connected to the capacitors C1, C2 and C3 respectively.

In the Balun circuit 300 of the present embodiment of the invention, the first coplanar spiral structure and the second coplanar spiral structure are coupled by way of edge coupling which is less affected by external reference voltage, hence producing excellent coupling.

The Balun circuit of the present embodiment of the invention can only use two wiring layers and are particularly suitable to be manufactured by the IPD process, that is, the thin film process. According to the Balun circuit manufactured by the IPD process, the width and the space of the wires of the coils can be precisely controlled, so that the width and the space of the wires are smaller than that of the Balun circuit manufactured by the conventional LTCC process. Compared with the Balun circuit manufactured by the LTCC process, the Balun circuit manufactured by the IPD process of the present embodiment of the invention is further advantaged by having a reduced layout area.

Referring to FIG. 4A, an example of disposition relationship between an IPD 402 having a Balun circuit 300 of the present embodiment of the invention and an RF transceiver chip 404 is shown. The IPD 402 is disposed on the substrate 406. The RF transceiver chip 404 is disposed on IPD 402. The RF transceiver chip 404 is electrically connected to the substrate 406 via holes 405 of the IPD 402. Thus, compared with the Balun circuit manufactured by conventional LTCC process which must be disposed on the substrate for electrically connecting the RF transceiver chip disposed in other area of the substrate, the IPD 402 of the present embodiment of the invention has the advantage of saving the area of the substrate 406.

Referring to FIG. 4B, another example of disposition relationship between an IPD 408 having a Balun circuit of the present embodiment of the invention and an RF transceiver chip 410 is shown. The IPD) 408 is disposed on the substrate 412. The RF transceiver chip 410 is disposed in the space under the IPD 408. Such disposition also has the advantage of saving the area of the substrate 412.

Figure 5:
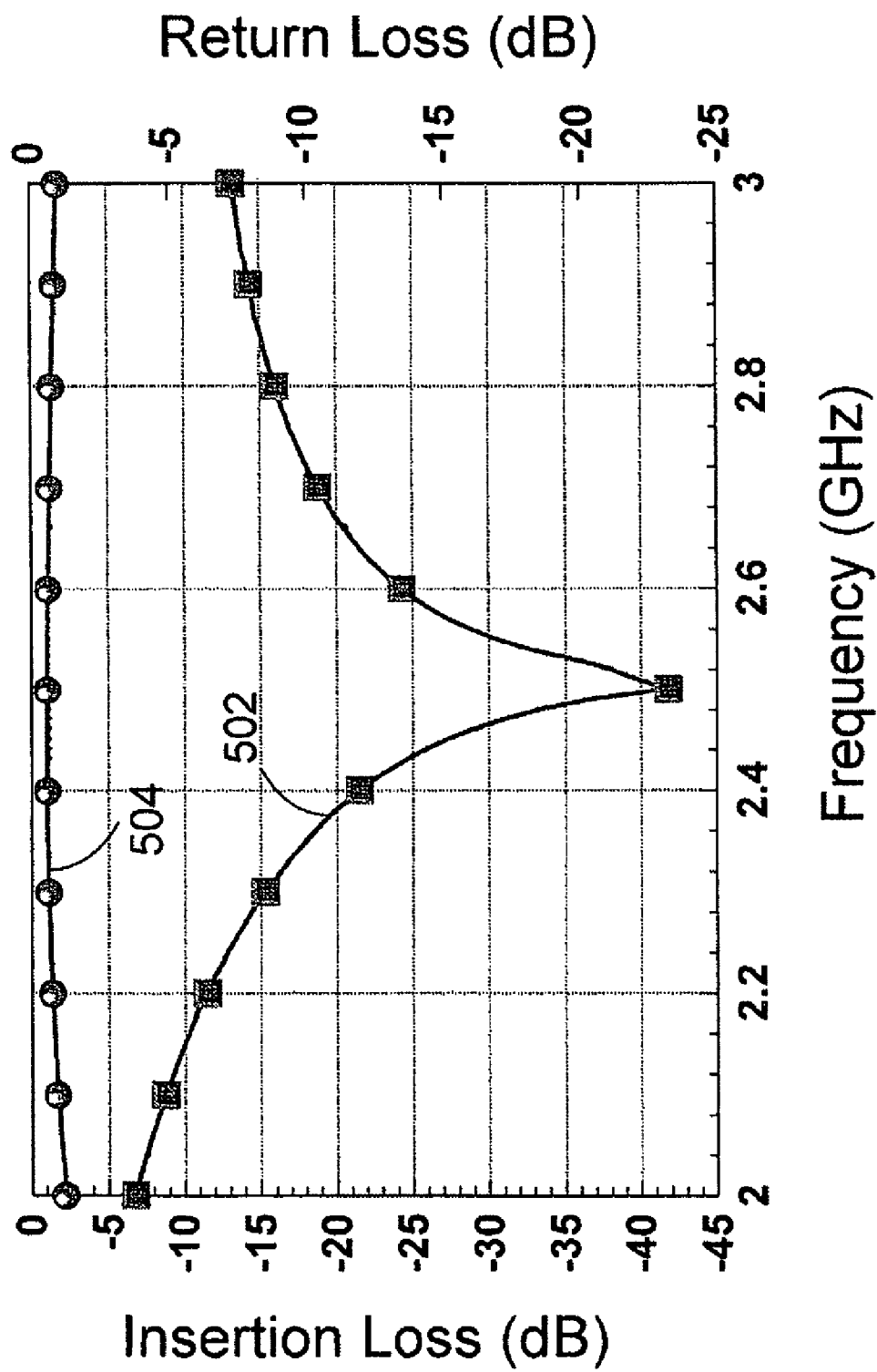
FIG. 5 shows a simulation result of return loss and insertion loss of a Balun circuit of the present embodiment of the invention.

Referring to FIG. 5, a simulation result of return loss and insertion loss of a Balun circuit of the present embodiment of the invention is shown. The dual-port Balun circuit is simulated under the conditions that the first end 312 being the unbalance port 110 is used as an input port, and the third end 332 and the fourth end 334 being the balance ports 112 and 114 are used as output ports. According to the curve 502 of return loss and the curve 504 of insertion loss of FIG. 5, around the frequency of 2.5 GHz, the return loss is about −42 dB, and the insertion loss is about −1 dB. Around the frequency of 2.5 GHz, the Balun circuit 300 of the present embodiment of the invention indeed completes signal transformation.

Figure 6:
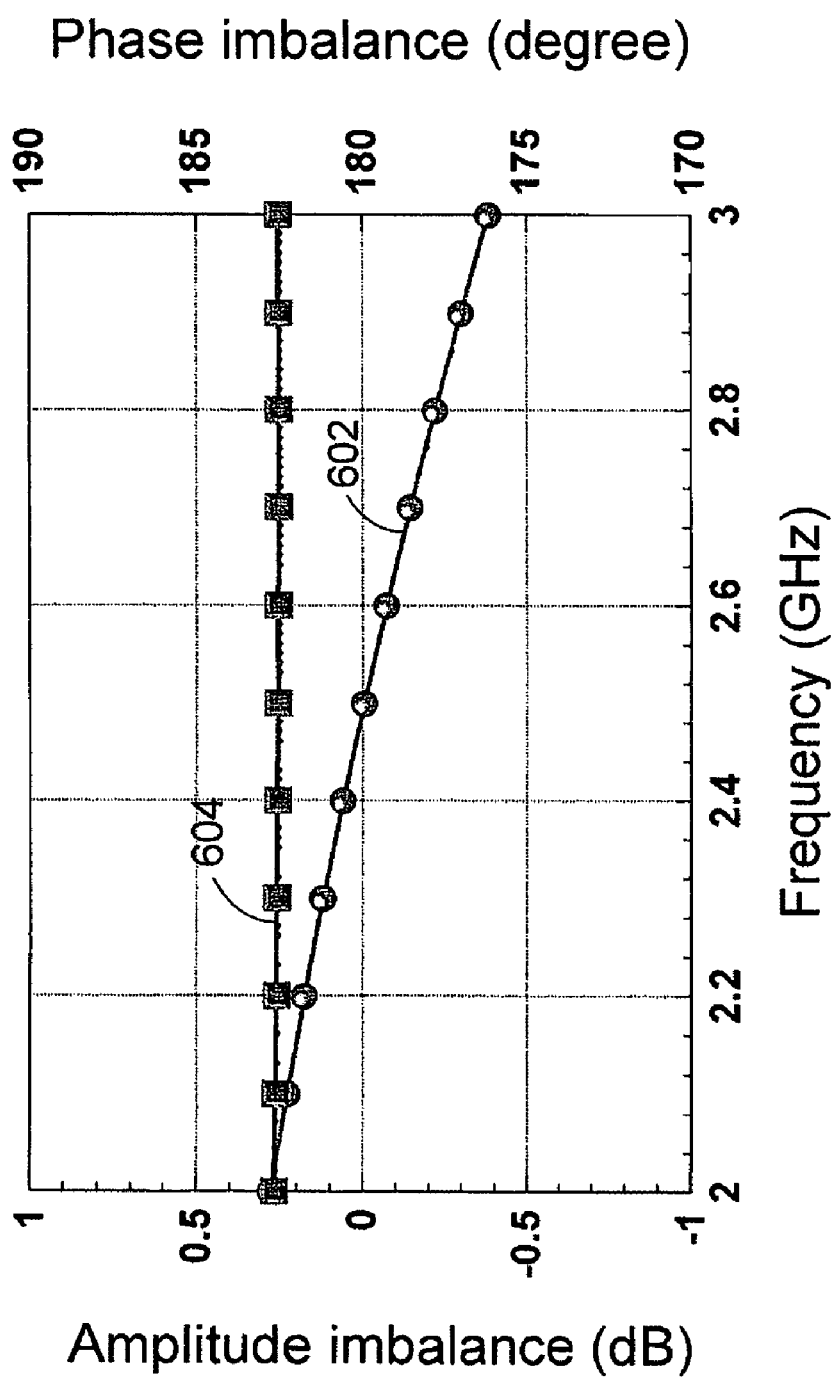
FIG. 6 shows a simulation result of amplitude imbalance and phase imbalance of two outputted signals of a Balun circuit of the present embodiment of the invention.

Referring to FIG. 6, a simulation result of amplitude imbalance and phase imbalance of two outputted signals of a Balun circuit of the present embodiment of the invention is shown. According to the curve 602 of the amplitude imbalance of the signals outputted by the third end 332 and the fourth end 334, the amplitude imbalance of the two outputted signals range between 0.25 and −0.37 when the frequency ranges between 2 GHz and 3 GHz. According to the curve 604 of the phase imbalance of the signals outputted by the third end 332 and the fourth end 334, the phase imbalance of the two outputted signals is about 182.5 degrees. Thus, the Balun circuit of the present embodiment of the invention indeed conforms to the requirement that the amplitudes of two signals outputted by the Balun circuit are substantially the same and the phase imbalance is substantially 180 degrees.

In the above disclosure, the Balun circuit 100 has three capacitors C1, C2 and C3. However, the Balun circuit 100 can also do without the capacitors C1, C2 and C3.

The Balun circuit manufactured by the IPD process of the invention has the advantages of reducing the layout area and saving the substrate area, so that communication devices using the Balun circuit of the invention can further achieves the requirements of lightweight, small size, and compactness, hence has even better market competiveness.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Balun circuit manufactured by integrate passive device (IPD) process, comprising:
    a substrate;
    a first coplanar spiral structure having a first end, a second end, a plurality of first left coils, a plurality of first right coils and a first bridge, wherein one end of the innermost first left coil is electrically connected to the innermost first right coil through a first bridge, the first end is electrically connected to the outermost first left coil, and the second end is electrically connected to the outermost first right coil; and
    a second coplanar spiral structure having a third end, a fourth end, a plurality of second left coil, a plurality of second right coil and a second bridge, wherein one end of the innermost second left coil is electrically connected to the innermost second right coil through the second bridge, the third end is electrically connected to the outermost second left coil, and the fourth end is electrically connected to the outermost second right coil;
    wherein the first left coils and the second left coils are interlaced, and the first right coils and the second right coils are interlaced;
    wherein the substrate has a first wiring layer and a second wiring layer, the first left coils and the first right coils are disposed on the first wiring layer, the first bridge is disposed on the second wiring layer.

2. The Balun circuit according to claim 1, wherein the substrate has a first wiring layer and a second wiring layer, the second left coils and the second right coils are disposed on the first wiring layer, and the second bridge is disposed on the second wiring layer.

3. The Balun circuit according to claim 1, wherein the first left coils and the second left coils are equally spaced apart.

4. The Balun circuit according to claim 1, wherein the first right coils and the second right coils are equally spaced apart.

5. The Balun circuit according to claim 1, wherein the sum of the lengths of the first left coils is substantially equal to that of the first right coils.

6. The Balun circuit according to claim 1, wherein the sum of the lengths of the second left coils is substantially equal to that of the second right coils.

7. The Balun circuit according to claim 1, further comprising a plurality of capacitors, wherein the first end, the third end and the fourth end are electrically connected to the capacitors respectively.

8. A semiconductor circuit, including:
    a base substrate;
    an integrate passive device (IPD), including a Balun circuit, the Balun circuit comprising:
    a substrate;
    a first coplanar spiral structure having a first end, a second end, a first connecting line, a second connecting line, a plurality of first left coils, a plurality of first right coils, and at least one first intersecting structure, wherein at least two first left coils are electrically connected to the corresponding two first right coils through one first intersecting structure, the first end is electrically connected to the outermost first left coil through the first connecting line, and the second end is electrically connected to the outermost first right coil through the second connecting line; and
    a second coplanar spiral structure having a third end, a fourth end, a third connecting line, a fourth connecting line, a plurality of second left coils, a plurality of second right coils, and at least one second intersecting structure, wherein at least two second left coils are electrically connected to the corresponding two second right coil through one second intersecting structure, the third end is electrically connected to the innermost second left coil through the third connecting line, the fourth end is electrically connected to the innermost second right coil through the fourth connecting line, wherein the first left coils and the second left coils are interlaced, and so are the first right coils and the second right coils interlaced; and
    a chip, electrically connected to the IPD, the chip overlapped with the IPD relative to the base substrate.

9. The semiconductor circuit according to claim 8, wherein the substrate has a first wiring layer and a second wiring layer, the first left coils and the first right coils are disposed on the first wiring layer, the first intersecting structure is disposed on the second wiring layer.

10. The semiconductor circuit according to claim 9, wherein the innermost first left coil is electrically connected to the first intersecting structure through a first via hole, and the first intersecting structure is electrically connected to the innermost first right coil through a second via hole.

11. The semiconductor circuit according to claim 8, wherein the substrate has a first wiring layer and a second wiring layer, the second left coils and the second right coils are disposed on the first wiring layer, and the second intersecting structure is disposed on the second wiring layer.

12. The semiconductor circuit according to claim 8, wherein the first left coils and the second left coils are equally spaced apart.

13. The semiconductor circuit according to claim 8, wherein the first right coils and the second right coils are equally spaced apart.

14. The semiconductor circuit according to claim 8, wherein the sum of the lengths of the first left coils is substantially equal to that of the first right coils.

15. The semiconductor circuit according to claim 8, wherein the sum of the lengths of the second left coils is substantially equal to that of the second right coils.

16. The semiconductor circuit according to claim 8, wherein the Balun circuit further comprises a plurality of capacitors, and the first end, the third end and the fourth end are electrically connected to the capacitors respectively.

17. The semiconductor circuit according to claim 8, wherein the first end is used as an unbalance port, the second end is grounded, and the third end and the fourth end are used as balance ports, the third end and the fourth end output two signals substantially having the same amplitude, and the phase imbalance of the two signals is 180 degrees.

18. The semiconductor circuit according to claim 8, wherein the IPD is disposed on the base substrate, the chip is disposed on the IPD, and the chip is electrically connected to the base substrate via a plurality of holes of the IPD.

19. The semiconductor circuit according to claim 8, wherein the IPD is disposed on the base substrate and the chip is disposed in the space between the IPD and the base substrate.

20. A Balun circuit manufactured by integrate passive device (IPD) process, comprising:
  a substrate;
  a first coplanar spiral structure having a first end, a second end, a plurality of first left coils, a plurality of first right coils and a first bridge, wherein one end of the innermost first left coil is electrically connected to the innermost first right coil through a first bridge, the first end is electrically connected to the outermost first left coil, and the second end is electrically connected to the outermost first right coil;
  a second coplanar spiral structure having a third end, a fourth end, a plurality of second left coil, a plurality of second right coil and a second bridge, wherein one end of the innermost second left coil is electrically connected to the innermost second right coil through the second bridge, the third end is electrically connected to the outermost second left coil, and the fourth end is electrically connected to the outermost second right coil, wherein the first left coils and the second left coils are interlaced, and the first right coils and the second right coils are interlaced; and
  a plurality of capacitors, wherein the first end, the third end and the fourth end are electrically connected to the capacitors respectively.

* * * * *